(12) United States Patent
Chiang

(10) Patent No.: US 10,656,218 B2
(45) Date of Patent: May 19, 2020

(54) LEAKAGE CURRENT DETECTION APPARATUS AND DETECTION METHOD THEREOF

(71) Applicant: Winbond Electronics Corp., Taichung (TW)

(72) Inventor: Ju-An Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 297 days.

(21) Appl. No.: 15/842,881

(22) Filed: Dec. 15, 2017

(65) Prior Publication Data
US 2019/0064245 A1     Feb. 28, 2019

(30) Foreign Application Priority Data
Aug. 22, 2017    (CN) .......................... 2017 1 0722782

(51) Int. Cl.
*G01R 31/50*     (2020.01)
*G01R 31/28*     (2006.01)

(52) U.S. Cl.
CPC .......... *G01R 31/50* (2020.01); *G01R 31/2879* (2013.01)

(58) Field of Classification Search
CPC .......................... G01R 31/025; G01R 31/2879
USPC ....................................... 324/762.03; 320/164
See application file for complete search history.

(56) References Cited

U.S. PATENT DOCUMENTS

2016/0254688 A1*  9/2016  Jung .................... H02J 7/007
                                                                320/164

FOREIGN PATENT DOCUMENTS

JP           5404537           2/2014

* cited by examiner

*Primary Examiner* — Farhana A Hoque
(74) *Attorney, Agent, or Firm* — JCIPRNET

(57) ABSTRACT

A leakage current detection apparatus and detection method thereof for detecting a leakage current generated when a tested circuit is in a standby state are provided. The leakage current detection apparatus includes a capacitor, a pre-charge circuit, a discharge current generator and a detection result generator. The pre-charge current is provided to pre-charge the capacitor during a first time interval. The discharge current generator generates a discharge current according to the leakage current when the tested circuit is in a standby state and during a second time interval, and the capacitor is discharged accordingly. The leakage detection result is generated in the second time interval by comparing a voltage value on a detection end and a voltage value of a preset reference voltage.

14 Claims, 6 Drawing Sheets

LEAKAGE CURRENT DETECTION APPARATUS AND DETECTION METHOD THEREOF

CROSS-REFERENCE TO RELATED APPLICATION

This application claims the priority benefit of China application serial no. 201710722782.3, filed on Aug. 22, 2017. The entirety of the above-mentioned patent application is hereby incorporated by reference herein and made a part of this specification.

TECHNICAL FIELD

The invention is related to a leakage current detection apparatus and a detection method thereof, and particularly to a leakage current detection apparatus that can detect and reduce leakage current when a tested circuit is in a standby state and a detection method thereof.

DESCRIPTION OF RELATED ART

Along with advancement of technologies, elements of integrated circuit (IC) can be minimized to nano-scale size, and related technicians has been working on reducing the threshold voltage and the operation voltage of transistors. However, in order to achieve the design requirement mentioned above, the situation of rising of leakage current generated by electronic circuit is likely to take place. In addition, when working in an operation state, an electronic apparatus can be easily affected by the heat energy generated from the inside of a chip or ambient temperature, which causes the electronic apparatus to generate unrespectable amount of leakage current due to change of temperature in operation. The above-mentioned situation not only significantly affects the work efficiency of the electronic circuit, but also reduces yield rate of manufacturing of chip and performance of electronic apparatus. Therefore, it is an issue for persons skilled in the art to find out how to effectively detect the leakage current of a tested circuit when the electronic apparatus works under an operation state and to reduce the leakage current.

SUMMARY OF INVENTION

The invention provides a leakage current detection apparatus and a detection method, which is capable of detecting and reducing leakage current of a tested circuit.

In the invention, the leakage current detection apparatus detects a leakage current generated when a tested circuit is in a standby state, including a capacitor, a pre-charge circuit, a discharge current generator and a detection result generator. The capacitor is coupled between a detection end and a reference ground end. The pre-charge circuit is coupled to the detection end, and provides a pre-charge current to pre-charge the capacitor during a first time interval. The discharge current generator is coupled to the detection end and the tested circuit, and generates a discharge current according to the leakage current when the tested circuit is in a standby state and during a second time interval, and the capacitor is discharged according to the discharge current. The detection result generator is coupled to the capacitor, and generates a leakage current detection result in the second time interval by comparing a voltage value on the detection end with a voltage value of a preset reference voltage, wherein the first time interval takes place before the second time interval.

In the invention, a leakage current detection method of the leakage current detection apparatus detects leakage current generated when a tested circuit is in a standby state, wherein the leakage current detection method includes providing a pre-charge current to pre-charge a capacitor in a first time interval; generating a discharge current according to the leakage current when the tested circuit is in the standby state and during a second time interval, and discharging the capacitor according to the discharge current; generating a leakage current detection result in the second time interval by comparing a voltage value on a detection end with a voltage value of a preset reference voltage, wherein the first time interval takes place before the second time interval.

In summary, the leakage current detection apparatus of the invention pre-charges the capacitor in the first time interval by using the pre-charge circuit, and discharges the capacitor in the second time interval by using the discharge current generator. By using the detection result generator in the second time interval, the leakage current detection result of the leakage current of the tested circuit is generated by comparing the discharge voltage value on the capacitor with the voltage value of the preset reference voltage. Accordingly, the operation voltage generator can determine whether to decrease the operation voltage of the tested circuit according to the leakage current detection result so as to reduce the leakage current generated when the tested circuit operates in the standby state.

In order to make the aforementioned features and advantages of the invention more comprehensible, embodiments accompanying figures are described in detail below.

DESCRIPTION OF EMBODIMENTS

Figure 1:
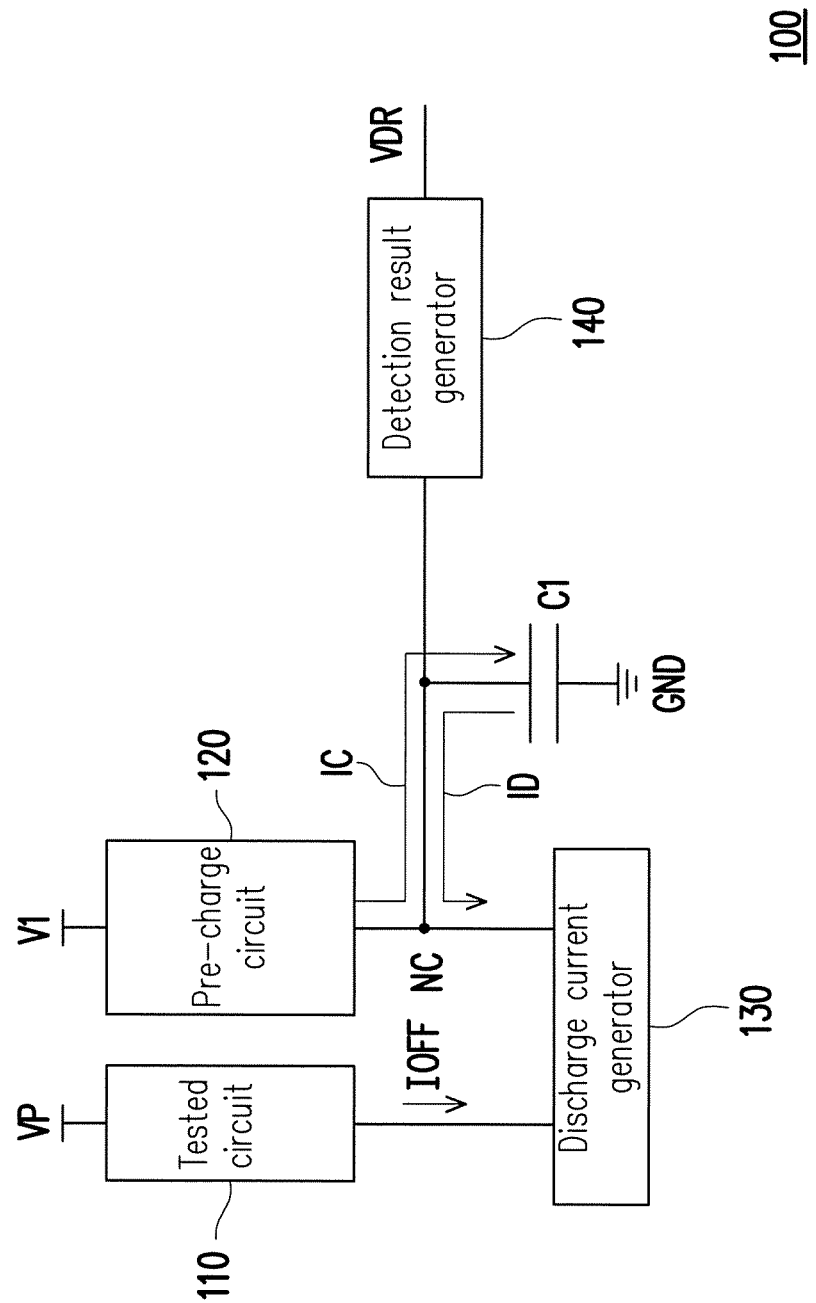
FIG. 1 is a block view of a leakage current detection apparatus according to an embodiment of the invention.

Referring to FIG. 1, a leakage current detection apparatus 100 detects a leakage current IOFF generated when a tested circuit 110 is in a standby state, wherein the leakage current detection apparatus 100 includes a pre-charge circuit 120, a discharge current generator 130, a detection result generator 140 and a capacitor C1. The tested circuit 110 receives an operation voltage VP as a power voltage and performs operation. Specifically, when the tested circuit 110 operates under the standby state (the tested circuit 110 does not perform operation and there is no substantial signal computing and transmission operation in the tested circuit 110), the tested circuit 110 is likely to generate different levels of leakage current IOFF due to effect of ambient temperature, manufacturing variation and voltage change of operation voltage VP.

In the embodiment, the discharge current generator 130 is coupled to the tested circuit 110, and receives the leakage current IOFF generated by the tested circuit 110. The pre-charge circuit 120 is coupled to the discharge current generator 130 via a detection end NC. In addition, the capacitor C1 is coupled between the detection end NC and a reference ground end GND. The detection result generator 140 receives a voltage on the detection end NC to generate a leakage current detection result VDR.

Regarding the details of operation of the leakage current detection apparatus 100, when the leakage current detection apparatus 100 works in the first time interval, the pre-charge circuit 120 provides a pre-charge current IC to pre-charge the capacitor C1, and increases the voltage value on the detection end NC to a preset voltage value. Next, in the second time interval after the first time interval, the discharge current generator 130 generates a discharge current ID according to the leakage current IOFF of the tested circuit 100 when the tested circuit 100 operates in the standby state and during the second time interval, and discharges the capacitor C1 according to the discharge current ID. At this point, the voltage value on the detection end NC is decreased along with the discharge operation of the capacitor C1. In the second time interval, the detection result generator 140 generates the leakage current detection result VDR by comparing the voltage value on the detection end NC with the voltage value of a preset reference voltage. Specifically, when the detection result generator 140 determines that the voltage on the detection end NC is decreased to be lower than the preset reference voltage in the second time interval, it represents that the leakage current IOFF generated by the tested circuit 110 is too large, and the detection result generator 140 generates the leakage current detection result VDR indicating that the leakage current IOFF is too large. Relatively, if the detection result generator 140 does not determine that the voltage on the detection end NC is lower than the preset reference voltage in the second time interval, it represents that the leakage current IOFF generated by the tested circuit 110 is not too large, and the detection result generator 140 generates the leakage current detection result VDR indicating that the leakage current IOFF is not too large. Specifically, in the first time interval, the leakage current detection apparatus 100 has not started to detect the leakage current IOFF generated when the tested circuit 110 is in the standby state. In addition, in the second time interval, the leakage current detection apparatus 100 starts to detect the leakage current IOFF generated when the tested circuit 110 is in the standby state.

In the embodiment, the leakage current detection result VDR may be a digital signal. Take the leakage current detection result VDR with one bit as an example; the detection result generator 140 may generate a leakage current detection result VDR having a first logical level to indicate that the leakage current IOFF generated by the tested circuit 110 is too large, and generates a leakage current detection result VDR having a second logical level to indicate that the leakage current IOFF generated by the tested circuit 110 is not too large, wherein the first logical level is complementary to the second logical level.

On the other hand, in the embodiment, the tested circuit 110 may be disposed in a core circuit area of an integrated circuit. Therefore, the tested circuit 110 may be disposed by duplicating a portion of the core circuit in the integrated circuit. For instance, the tested circuit 110 may be a combined logical circuit generated by one or more logical gates of any type, which should not be construed as a limitation to the invention.

Figure 2:
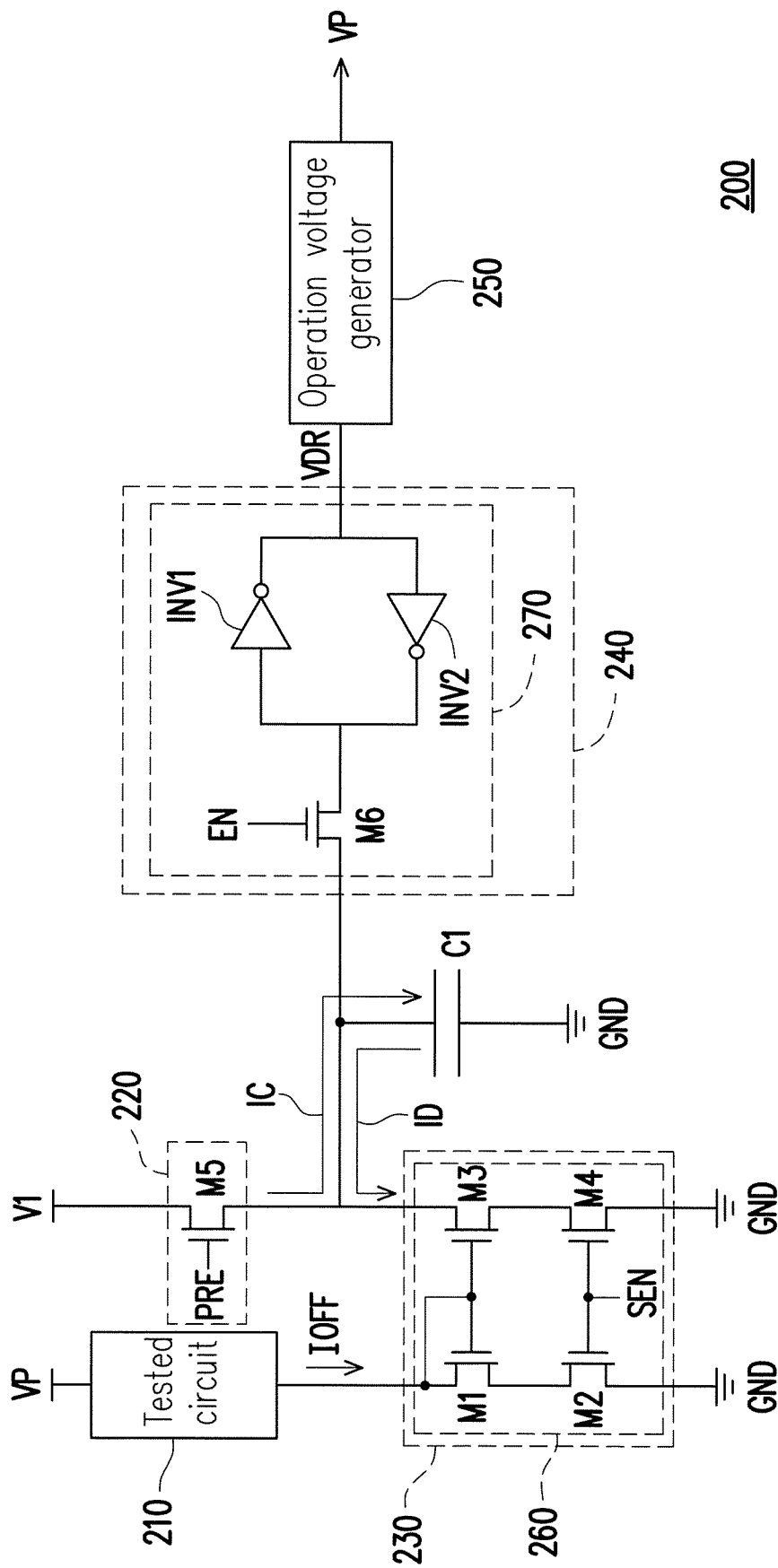
FIG. 2 is a circuit schematic diagram of a leakage current detection apparatus according to an embodiment of the invention.

Referring to FIG. 2, a pre-charge circuit 220 of the embodiment includes a transistor M5. A first end of the transistor M5 is coupled to a pre-charge voltage V1, a second end of the transistor M5 is coupled to the detection end NC, and a control end of the transistor M5 is coupled to a pre-charge signal PRE. When the leakage current detection apparatus 200 works in the first time interval, the pre-charge circuit 220 turns on the transistor M5 through the pre-charge signal PRE, and the pre-charge circuit 220 generates a pre-charge current IC to pre-charge the capacitor C1 according to the received charge voltage V1, and pre-charges the voltage value on the detection end NC to the voltage value of the pre-charge voltage V1. Here, the voltage value of the charge voltage V1 may be equal to or not equal to the voltage value of the operation voltage VP.

On the other hand, in the embodiment, a discharge current generator 230 may be a current mirror circuit 260. The current mirror circuit 260 is coupled between a path where a tested circuit 210 is coupled to the reference ground end GND. When the leakage current detection apparatus 200 works in the second time interval, the current mirror circuit 260 generates the discharge current ID by mirroring the leakage current IOFF. Specifically, the current mirror circuit 260 includes a first transistor M1, a second transistor M2, a third transistor M3 and a fourth transistor M4. A first end of the first transistor M1 is coupled to a control end of the tested circuit 210 and the first transistor M1. A first end of the second transistor M2 is coupled to a second end of the first transistor M1. A second end of the second transistor M2 is coupled to the reference ground end GND. A first end of the third transistor M3 is coupled to the detection end NC. A control end of the third transistor M3 is coupled to a control end of the first transistor M1. A first end of the fourth transistor M4 is coupled to a second end of the third transistor M3. A second end of the fourth transistor M4 is coupled to the reference ground end GND. A control end of the fourth transistor M4 is coupled to a control end of the second transistor M2.

It should be mentioned that the current mirror circuit 260 has a detection signal SEN. When the leakage current detection apparatus 200 works in the second time interval, the detection signal SEN may turn on the second transistor M2 and the fourth transistor M4 and makes the current mirror circuit 260 start to work. Accordingly, the current mirror circuit 260 may generate the discharge current ID by mirroring the leakage current IOFF, and discharge the capacitor C1 according to the discharge current ID. Relatively, when not in the second time interval (e.g., in the first time interval), the detection signal SEN may turn off the second transistor M2 and the fourth transistor M4, and stop the current mirroring operation of the current mirror circuit 260.

On the other hand, in the embodiment, a detection result generator 240 may include a latch 270. Specifically, the latch 270 includes a first inverter INV1, a second inverter INV2 and a sixth transistor M6. Specifically, a first end of the sixth transistor M6 is coupled to the detection end NC, a second end of the sixth transistor M6 is coupled to an input end of the first inverter INV1, a control end of the sixth transistor M6 receives an enabling signal EN, and determines a sampling time point of the latch 270 according to the enabling signal EN. An output end of the first inverter INV1 is coupled to an input end of a second inverter INV2 and generates the leakage current detection result VDR. An output end of the second inverter INV2 is coupled to the input end of the first inverter INV1.

In addition, the latch 270 provides a threshold voltage as a reference voltage. Specifically, the threshold voltage may be determined by a manufacturing parameter of a circuit element in the latch 270. When the leakage current detection apparatus 200 works at a sampling time point in the second time interval, the sixth transistor M6 is turned on. Accordingly, the latch 270 can receive a voltage value on the detection end NC, and the latch 270 generates the leakage current detection result VDR according to whether the voltage value on the detection end NC is larger than a threshold voltage provided by the latch 270.

In the embodiment, the threshold voltage of the latch 270 is determined according to the manufacturing parameter of the circuit element of the latch 270, and there is no need to compare additional reference voltage with the voltage value on the detection end NC, and thus the characteristics of saving power, less circuit element and higher accuracy can be achieved.

On the other hand, in the embodiment, the detection result generator 240 is further coupled to an operation voltage generator 250. The operation voltage generator 250 receives the leakage current detection result VDR. Specifically, the operation voltage generator 250 generates the operation voltage VP of the tested circuit 210, and the operation voltage generator 250 determines whether to decrease the voltage value of the operation voltage VP according to the received leakage current detection result VDR. It should be mentioned that, when the leakage current detection result VDR indicates that the leakage current IOFF of the tested circuit 210 is too large, the operation voltage generator 250 may decrease the voltage value of the operation voltage VP according to the leakage current detection result VDR, thereby reducing the leakage current IOFF generated when the tested circuit 210 operates in the standby state.

Specifically, when the leakage current detection result VDR indicates that the leakage current IOFF of the tested circuit 210 is too large, the operation voltage generator 250 may decrease an offset value of the operation voltage VP of the tested circuit 210 according to the leakage current detection result VDR. It should be noted that the leakage current detection mechanism in the embodiment of the invention may be performed continuously. In the next leakage current detection cycle, if the leakage current detection result VDR still indicates that the leakage current IOFF of the tested circuit 210 is too large, the operation voltage generator 250 may further decrease an offset value of the operation voltage VP of the tested circuit 210 according to the leakage current detection result VDR. The offset value may be determined by designer depending on the actual application circumstances of the integrated circuit and there is no fixed limitation.

Figure 3:
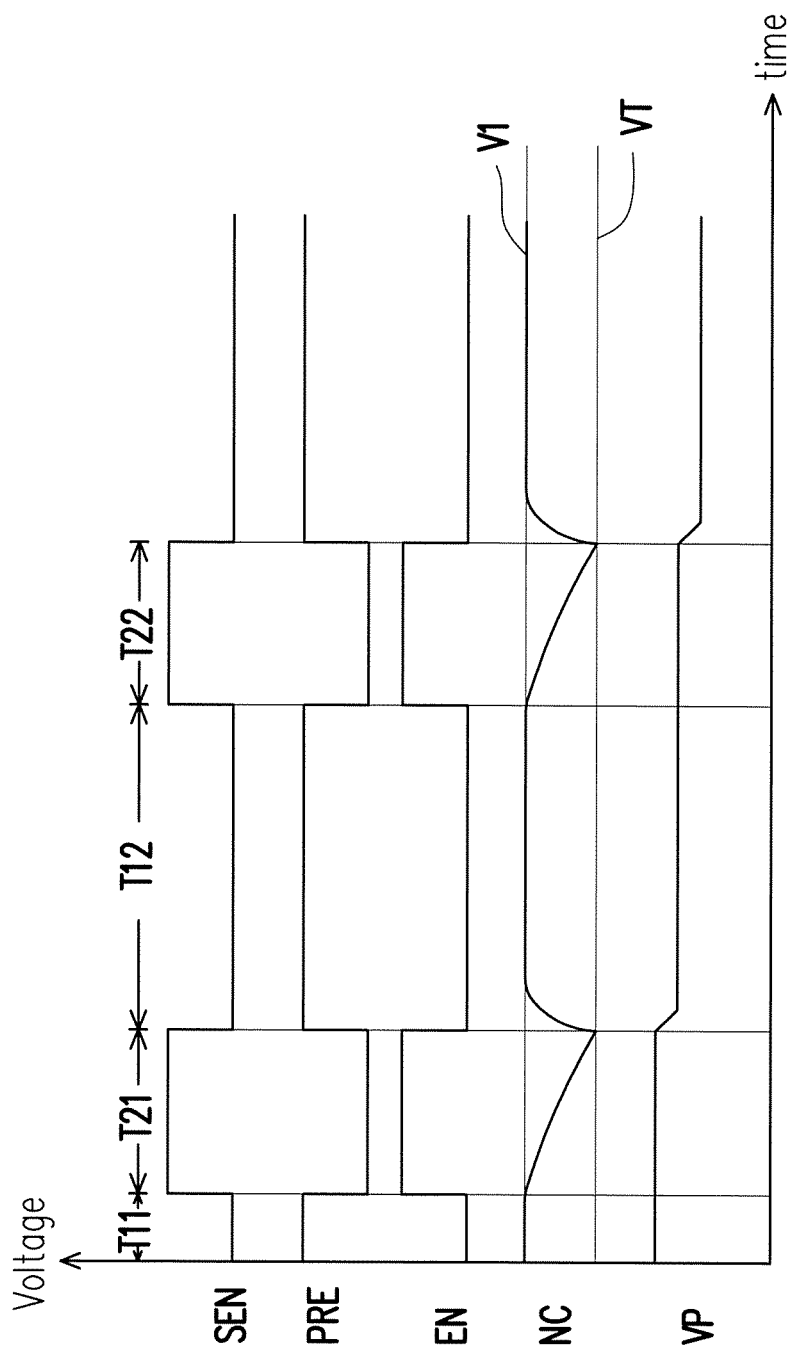
FIG. 3 is a schematic waveform diagram illustrating operation of a leakage current detection apparatus according to an embodiment of the invention.

Referring to FIG. 2 and FIG. 3, when the leakage current detection apparatus 200 works in a first time interval T11, the pre-charge circuit 220 turns on the transistor M5 via the pre-charge signal PRE, and the pre-charge circuit 220 generates the pre-charge current IC to pre-charge the capacitor C1 according to the received charge voltage V1, and pre-charges the voltage value on the detection end NC to the voltage value of the charge voltage V1. It should also be mentioned that, in the first time interval T11, since leakage current detection apparatus 200 has not started to detect the leakage current IOFF of the tested circuit 210, the detection signal SEN of the current mirror circuit 260 and the enabling signal EN of the latch 270 are not enabled.

Relatively, when the leakage current detection apparatus 200 works in a second time interval T21, the tested circuit 210 operates in the standby state and generates the leakage current IOFF, the pre-charge circuit 220 stops performing the pre-charging operation in the second time interval T21 according to the pre-charge signal PRE(disabled). Next, the current mirror circuit 260 turns on the second transistor M2 and the fourth transistor M4 via the detection signal SEN, and makes the current mirror circuit 260 start to work. Accordingly, the current mirror circuit 260 can generate the discharge current ID according to the leakage current IOFF, and discharge the capacitor C1 according to the discharge current ID. Therefore, the detection end NC performs discharging operation along with the capacitor C1 such that voltage value of the detection end NC begins to be decreased. In addition, in the second time interval T21, the latch 270 performs a latching operation according to the enabling signal EN that is enabled so as to receive and latch the voltage value on the detection end NC. Specifically, the latch 270 determines whether the voltage value on the detection end NC is smaller than a threshold voltage VT of the latch 270 according to the voltage value on the detection end NC so as to generate the leakage current detection result VDR.

It should be noted that when the operation voltage generator 250 determines that the voltage value on the detection end NC is decreased to be lower than the threshold voltage VT of the latch 270 according to the leakage current detection result VDR, the operation voltage generator 250 correspondingly decreases the operation voltage VP of the tested circuit 210. In the meantime, by decreasing the operation voltage VP, the leakage current IOFF of the tested circuit 210 operating in the standby state is reduced. It should be noted that, in the embodiment, the leakage current detection operation of the leakage current detection apparatus 200 may be performed continuously, and the next leakage current detection operation is performed in the following first time interval T12 and the second time interval T22. If it is still detected that the leakage current IOFF is too large in the second time interval T22, the voltage value of the operation voltage VP may be further decreased.

Figure 4A:
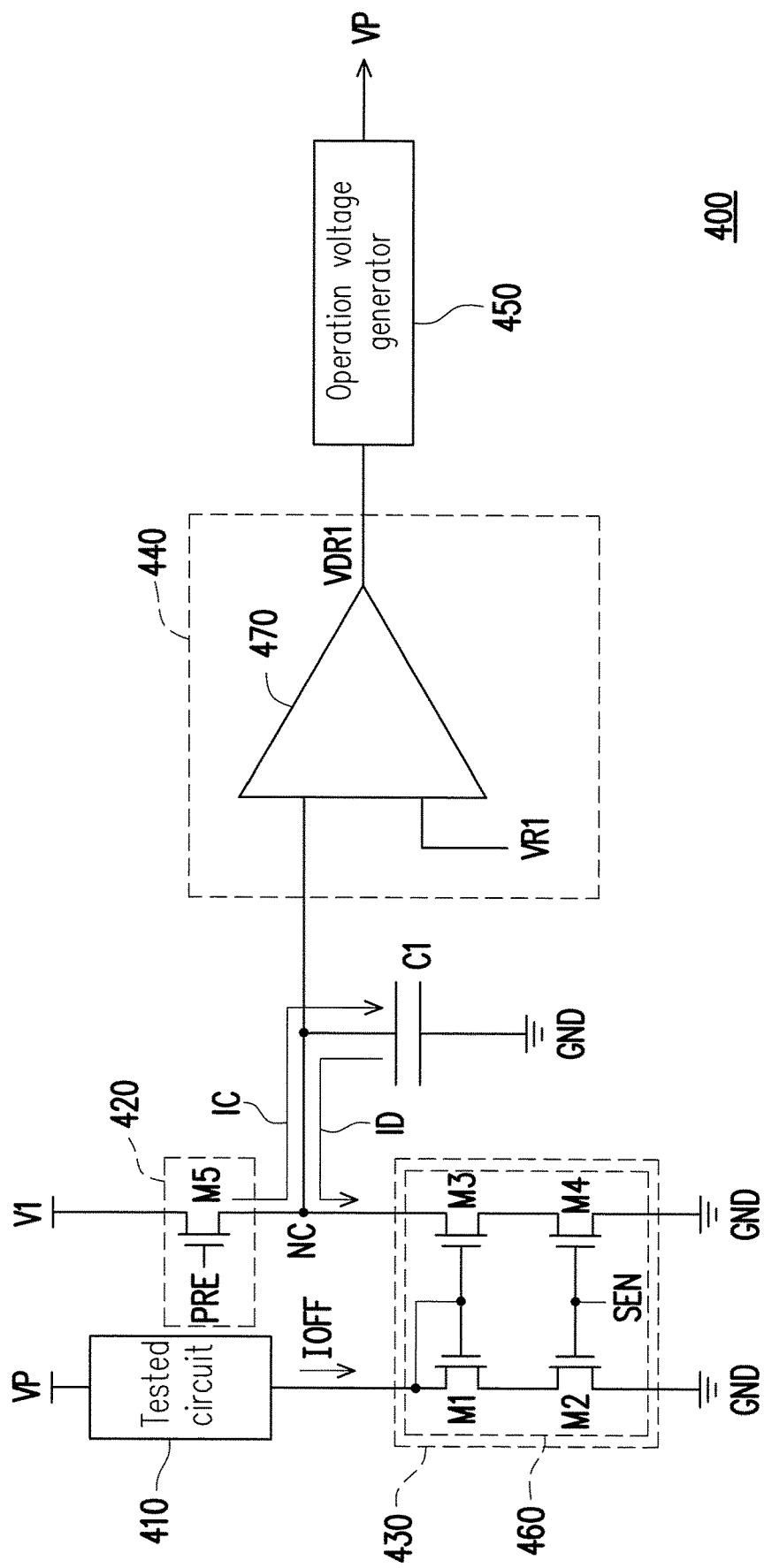
FIG. 4A is a schematic circuit diagram of a leakage current detection apparatus according to another embodiment of the invention.

Referring to FIG. 4A, different from the latch 270 in FIG. 2, the embodiment uses a comparator 470 to realize the effect of the detection result generator 440. Specifically, a first end of the comparator 470 is coupled to the detection end NC to receive the voltage value on the detection end NC; a second end of the comparator 470 is coupled to a reference voltage VR1. In addition, the comparator 470 generates a detection result VDR1 by comparing the voltage value on the detection end NC with the reference voltage VR1. Specifically, when the comparator 470 compares that the voltage value on the detection end NC is smaller than the reference voltage VR1, it represents that the leakage current IOFF of a tested circuit 410 is larger than the first threshold value. In the meantime, the comparator 470 generates the leakage current detection result VDR1 according to the voltage value on the detection end NC and the reference voltage VR1. In the embodiment, an output end of the comparator 470 is further coupled to an operation voltage generator 450 such that the operation voltage generator 450 receives the leakage current detection result VDR1. Specifically, when the leakage current detection result VDR1 indicates that the leakage current IOFF of the tested circuit 410 is too large, the operation voltage generator 450 may decrease one offset value of the operation voltage VP of the tested circuit 410 according to the leakage current detection result VDR1, thereby reducing the leakage current IOFF generated when the tested circuit 410 operates in the standby state.

Figure 4B:
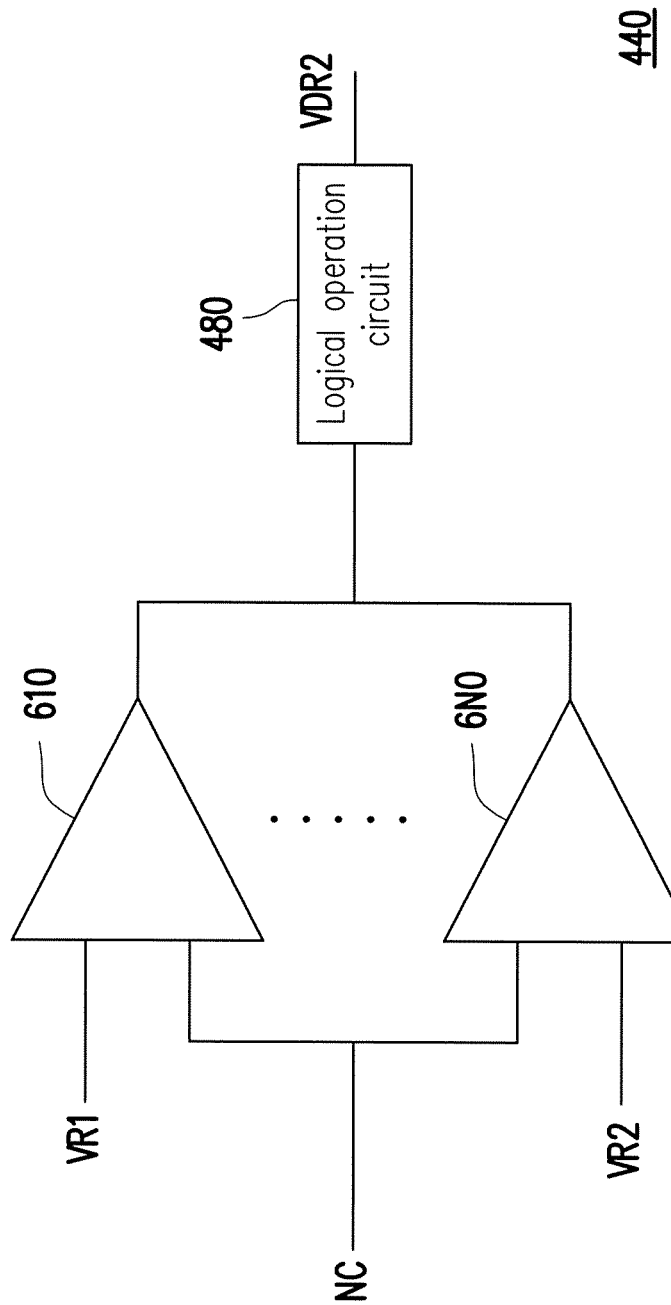
FIG. 4B is a schematic circuit diagram of a detection result generator in FIG. 4A according to another embodiment of the invention.

Referring to FIG. 4A and FIG. 4B, different from the single comparator 470 in FIG. 4A, the embodiment may use a plurality of comparators 610 to 6N0 to generate a detection result 440. The following embodiment is exemplified by using two comparators 610 and 6N0 for description. Specifically, a first end of the comparator 610 is coupled to the reference voltage VR1, and a second end of the comparator 610 is coupled to the detection end NC to receive the voltage value on the detection end NC. A first end of the comparator 6N0 is coupled to the second end of the comparator 610, and a second end of the comparator 6N0 is coupled to a reference voltage VR2, wherein the voltage value of the reference voltage VR1 is, for example, larger than a voltage value of the reference voltage VR2. It should be mentioned that, in the embodiment, output ends of the comparator 610 and the comparator 6N0 are coupled to an input end of a logical operation circuit 480 such that the logical operation circuit 480 receives an output result generated by the comparator 610 and the comparator 6N0. The logical operation circuit 480 may generate a leakage current detection result VDR2 according to the output result of the comparator 610 and comparator 6N0. Specifically, the logical operation circuit 480 may be a combined logical circuit generated by one or more logical gates of any type, which should not be construed as a limitation to the invention. In addition, an output end of the logical operation circuit 480 is further coupled to the operation voltage generator 450 such that the operation voltage generator 450 adjusts the voltage value of the operation voltage VP according to the leakage current detection result VDR2.

Specifically, when the voltage value of the detection end NC is smaller than the reference voltage VR1 and the voltage value on the detection end NC is larger than the reference voltage VR2, the leakage current detection result VDR2 indicates that the leakage current IOFF of the tested circuit is larger than a first threshold value, and thus the operation voltage generator 450 may decrease a first offset value of the operation voltage VP of the tested circuit 410 according to the leakage current detection result VDR2. On the other hand, when the voltage value on the detection end NC is smaller than the reference voltage VR1 and the voltage value on the detection end NC is smaller than the reference voltage VR2, the leakage current detection result VDR2 indicates that the leakage current IOFF of the tested circuit 410 is larger than a second threshold value, and thus the operation voltage generator 450 may decrease a second offset value of the operation voltage VP of the tested circuit 410 according to the leakage current detection result VDR2, thereby reducing the leakage current IOFF generated when the tested circuit 410 operates in the standby state, wherein the second offset value is larger than the first offset value.

Relatively, when the logical operation circuit 480 does not determine that the voltage on the detection end NC is smaller than the reference voltage VR1 and VR2 in the second time interval, it represents that the leakage current IOFF generated by the tested circuit 410 is not too large, and the logical operation circuit 480 generates the leakage current detection result VDR2 indicating that that the leakage current IOFF is not too large.

Figure 5:
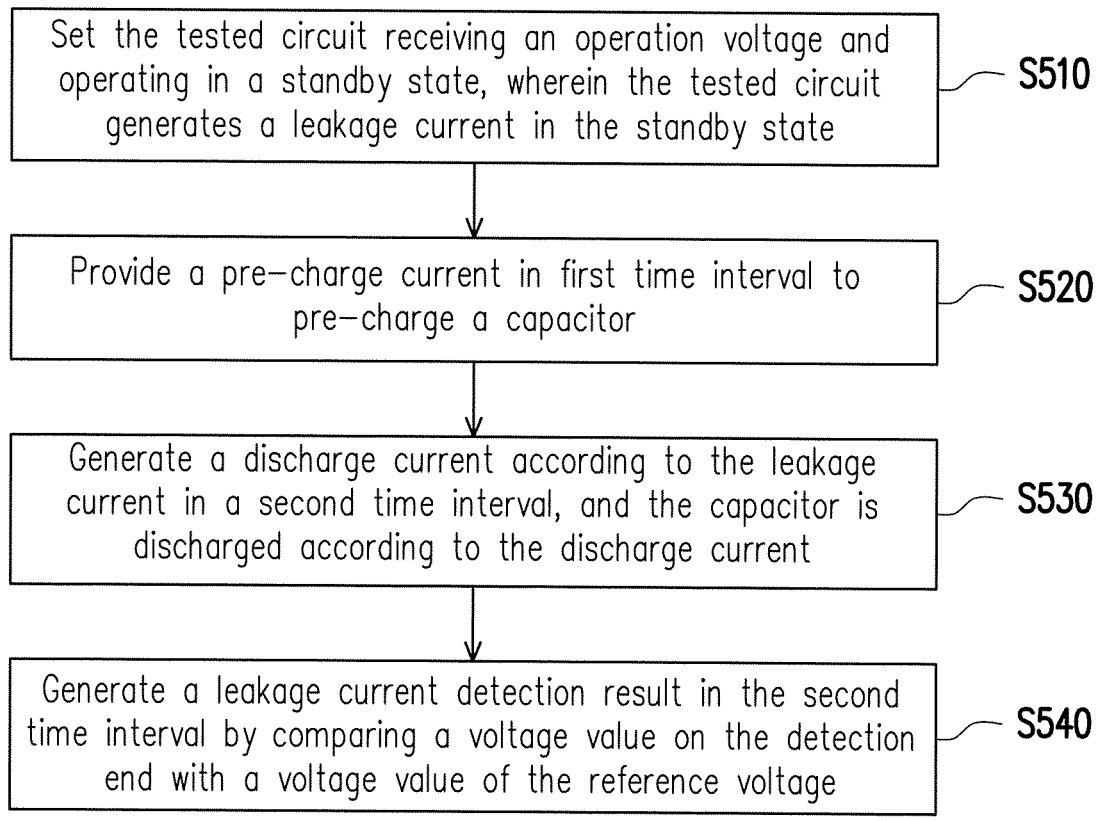
FIG. 5 is a flowchart illustrating a detection method of a leakage current detention apparatus according to an embodiment of the invention.

Referring to FIG. 5, in step S510, the tested circuit is set to receive the operation voltage and operate in the standby state. Specifically, the tested circuit generates leakage current in the standby state. The step S520 provides pre-charge current in the first time interval to pre-charge the capacitor. Next, in step S530, the discharge current is generated in the second time interval according to the leakage current and the capacitor is discharged according to the discharge current. Moreover, in step S540, the leakage current detection result is generated in the second time interval by comparing the voltage value on the detection end with the voltage value of the preset reference voltage.

The details of implementations of the above-mentioned steps are incorporated in the previously provided embodiments and implementation methods; no further descriptions are incorporated herein.

According to the previously provided embodiments and implementation methods, it can be obtained that, by using the leakage current detection mechanism of the embodiments of the invention, the leakage current of the integrated circuit can be monitored effectively and further decreased. Additionally, the integrated circuit can be easily affected by the heat energy generated from the inside of the chip or ambient temperature, leading to unexpected leakage current that is generated due to change of temperature. Therefore, by using the leakage current detection mechanism provided in the embodiment of the invention, even when the temperature in the integrated circuit/ambient temperature rises, the level of leakage current generated by the integrated circuit can still be inhibited effectively, thereby reducing the leakage current that is likely to be generated.

In summary, the invention uses the detection result generator in the leakage current detection apparatus to compare the discharge voltage value of the load capacitor generated due to the leakage current of the tested circuit with the preset reference voltage in the detection result generator so as to generate the leakage current result of the leakage current. If the operation voltage generator determines that the leakage current is larger than a threshold value according to the leakage current detection result, the operation voltage generator decrease the operation voltage of the tested circuit, thereby reducing the leakage current generated when the tested circuit operates in the standby state.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A leakage current detection apparatus, detecting a leakage current generated when a tested circuit is in a standby state, comprising:
 a capacitor, coupled between a detection end and a reference ground end;
 a pre-charge circuit, coupled to the detection end, providing a pre-charge current in a first time interval to pre-charge the capacitor;
 a discharge current generator, coupled to the detection end and the tested circuit, generating a discharge current according to the leakage current when the tested circuit is in the standby state and during a second time interval, and discharging the capacitor according to the discharge current; and
 a detection result generator, coupled to the capacitor and generating a leakage current detection result in the second time interval by comparing a voltage value on the detection end with a voltage value of a preset reference voltage,
 wherein the first time interval takes place before the second time interval.

2. The leakage current detection apparatus according to claim 1, wherein the detection result generator comprises:
 a latch, providing a threshold voltage as a reference voltage, and determining whether the voltage value on the detection end is smaller than the threshold voltage according to a sampling time point of an enabling signal in the second time interval to generate the leakage current detection result.

3. The leakage current detection apparatus according to claim 1, wherein the detection result generator comprises:
 a comparator, generating the leakage current detection result by comparing whether the voltage value on the detection end is smaller than the reference voltage or not.

4. The leakage current detection apparatus according to claim 1, further comprising:
 an operation voltage generator, generating an operation voltage,
 wherein the operation voltage generator receives the leakage current detection result, and determines whether to decrease a voltage value of the operation voltage according to the leakage current detection result, when the leakage current detection result indicates that the leakage current is larger than a threshold value, the operation voltage generator decreases an offset value of the operation voltage.

5. The leakage current detection apparatus according to claim 4, wherein when the leakage current detection result indicates that the leakage current is larger than a first threshold value, the operation voltage generator decrease a first offset value of the operation voltage, when the leakage current detection result indicates that the leakage current is larger than a second threshold value, the operation voltage generator decreases a second offset value of the operation voltage,
 wherein the first threshold value is smaller than the second threshold value, the first offset value is smaller than the second offset value.

6. The leakage current detection apparatus according to claim 1, wherein the discharge current generator comprises:
 a current mirror circuit, coupled between a path where the tested circuit is coupled to the reference ground end, the current mirror circuit generates the discharge current in the second time interval by mirroring the leakage current.

7. The leakage current detection apparatus according to claim 6, wherein the current mirror circuit comprises:
 a first transistor, a first end thereof is coupled to the tested circuit and a control end of the first transistor;
 a second transistor, a first end thereof is coupled to a second end of the first transistor, a second end of the second transistor is coupled to the reference ground end;
 a third transistor, a first end thereof is coupled to the detection end, a control end of the third transistor is coupled to the control end of the first transistor; and
 a fourth transistor, a first end thereof is coupled to a second end of the third transistor, a second end of the fourth transistor is coupled to the reference ground end, a control end of the fourth transistor is coupled to a control end of the second transistor.

8. The leakage current detection apparatus according to claim 1, wherein the pre-charge circuit comprises:
 a transistor, a first end thereof is coupled to a pre-charge voltage, a second end of the transistor is coupled to the detection end, and a control end of the transistor is coupled to a pre-charge signal.

9. The leakage current detection apparatus according to claim 1, wherein the tested circuit is disposed in a core circuit area of an integrated circuit.

10. A leakage current detection method, detecting a leakage current generated when a tested circuit is in a standby state, comprising:
 providing a pre-charge current in a first time interval to pre-charge a capacitor coupled between a detection end and a reference ground end to pre-charge a voltage value on the detection end;
 generating a discharge current according to the leakage current when the tested circuit is in the standby state and during a second time interval, and discharging the capacitor according to the discharge current for decreasing the voltage value on the detection end; and
 generating a leakage current detection result in the second time interval by comparing the voltage value on the detection end and a voltage value of a preset reference voltage,
 wherein the first time interval takes place before the second time interval.

11. The leakage current detection method according to claim 10, further comprising:
 determining whether to decrease a voltage value of an operation voltage according to the leakage current detection result, when the leakage current detection result indicates that the leakage current is larger than a threshold value, decreasing an offset value of the operation voltage.

12. The leakage current detection method according to claim 11, wherein the step of determining whether to decrease the voltage value of the operation voltage according to the leakage current detection result comprises:
 when the leakage current detection result indicates that the leakage current is larger than a first threshold value, decreasing a first offset value of the operation voltage; and
 when the leakage current detection result indicates that the leakage current is larger than a second threshold value, decreasing a second offset value of the operation voltage,
 wherein the first threshold value is smaller than the second threshold value, the first offset value is smaller than the second offset value.

13. The leakage current detection method according to claim 10, wherein the step of generating the leakage current detection result in the second time interval by comparing the voltage value on the detection end with the voltage value of the reference voltage comprises:
 providing a threshold voltage as the reference voltage, and determining whether the voltage value on the detection end is smaller than the threshold voltage according to a sampling time point of an enabling signal in the second time interval to generate the leakage current detection result.

14. The leakage current detection method according to claim 10, wherein the step of generating the leakage current detection result in the second time interval by comparing the voltage value on the detection end with the voltage value of the preset reference voltage comprises:
 generating the leakage current detection result by comparing whether the voltage value on the detection end is smaller than the reference voltage.

* * * * *